United States Patent

Foschino

Patent Number: 6,017,104
Date of Patent: Jan. 25, 2000

[54] CABINET STRUCTURE, HAVING VARIABLE SIZE, FOR ELECTRIC AND/OR ELECTRONIC EQUIPMENTS

[75] Inventor: Carmine Foschino, deceased, late of Milan, Italy, legal representative Maurizio Foschino

[73] Assignee: CMS Costruzioni Meccaniche Sestesi SRL, Milan, Italy

[21] Appl. No.: 08/454,339

[22] PCT Filed: Oct. 19, 1994

[86] PCT No.: PCT/EP94/03441

§ 371 Date: Jan. 11, 1996

§ 102(e) Date: Jan. 11, 1996

[87] PCT Pub. No.: WO95/12302

PCT Pub. Date: May 4, 1995

[30] Foreign Application Priority Data

Oct. 26, 1993 [IT] Italy ............................. M1930822 U

[51] Int. Cl.[7] ..................................................... A47B 45/00
[52] U.S. Cl. ....................... 312/205; 312/223.1; 248/357
[58] Field of Search ............................... 312/205, 223.1, 312/223.2, 223.6; 211/190; 248/357

[56] References Cited

U.S. PATENT DOCUMENTS

| | | | |
|---|---|---|---|
| 2,500,037 | 3/1950 | Katz | 312/205 X |
| 2,531,110 | 11/1950 | Cisler | 312/223.6 X |
| 3,418,814 | 12/1968 | Groetschel | 248/357 X |
| 4,541,675 | 9/1985 | Everett | 211/190 X |
| 4,964,020 | 10/1990 | Savage et al. | 361/829 |
| 5,593,046 | 1/1997 | Katsuura et al. | 312/223.2 X |
| 5,626,406 | 5/1997 | Schmid | 312/223.2 X |

FOREIGN PATENT DOCUMENTS

| | | | |
|---|---|---|---|
| 464318 | 1/1992 | European Pat. Off. | 312/223.6 |
| 543067 | 5/1993 | European Pat. Off. | 312/223.6 |
| 1176512 | 11/1958 | France | 249/357 |
| 197808 | 8/1978 | France | 312/205 |
| 2525498 | 12/1976 | Germany | 312/226.6 |
| 2717183 | 11/1978 | Germany | 312/223.6 |
| 353133159 | 11/1978 | Japan | 312/223.1 |

*Primary Examiner*—Peter M. Cuomo
*Assistant Examiner*—David E. Allred
*Attorney, Agent, or Firm*—Helfgott & Karas, P C.

[57] ABSTRACT

A cabinet structure for housing electric or electronic equipments, has a front cabinet, a rear column whose height can be varied according to that of the front cabinet, structure fittings including a telescoping head to be superimposed to the column, a plurality of telescoping grid bottom plates, to be placed between two C-shaped profiles of a raceway for connecting the front cabinet to the rear column, together with a T-shaped crossbeam. The telescoping head and the grid bottom plates when in the telescoped position fit in their width to the width of the front cabinet which can range between a simple width for cabinet structures to be installed near a wall and a double width for cabinet structures to be installed in the middle of a room.

8 Claims, 5 Drawing Sheets

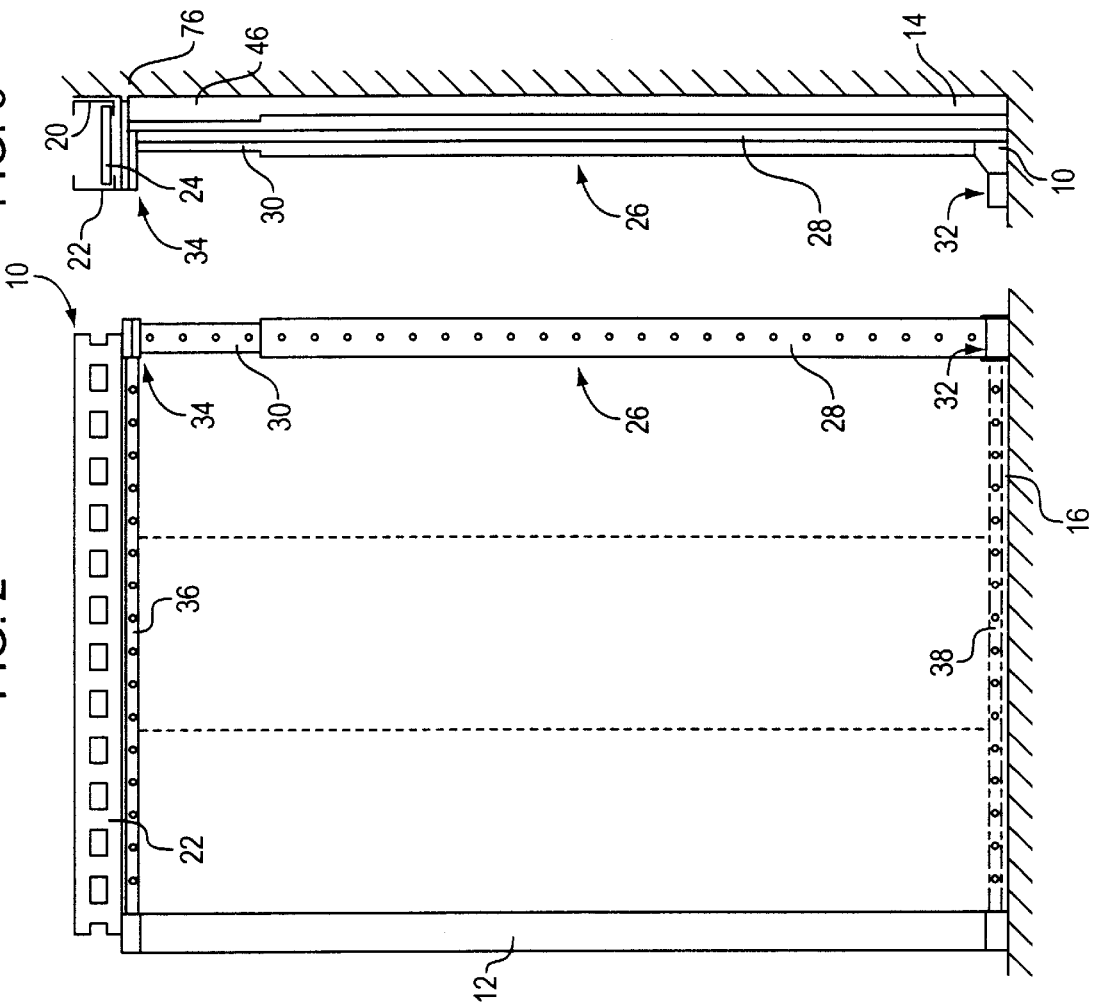

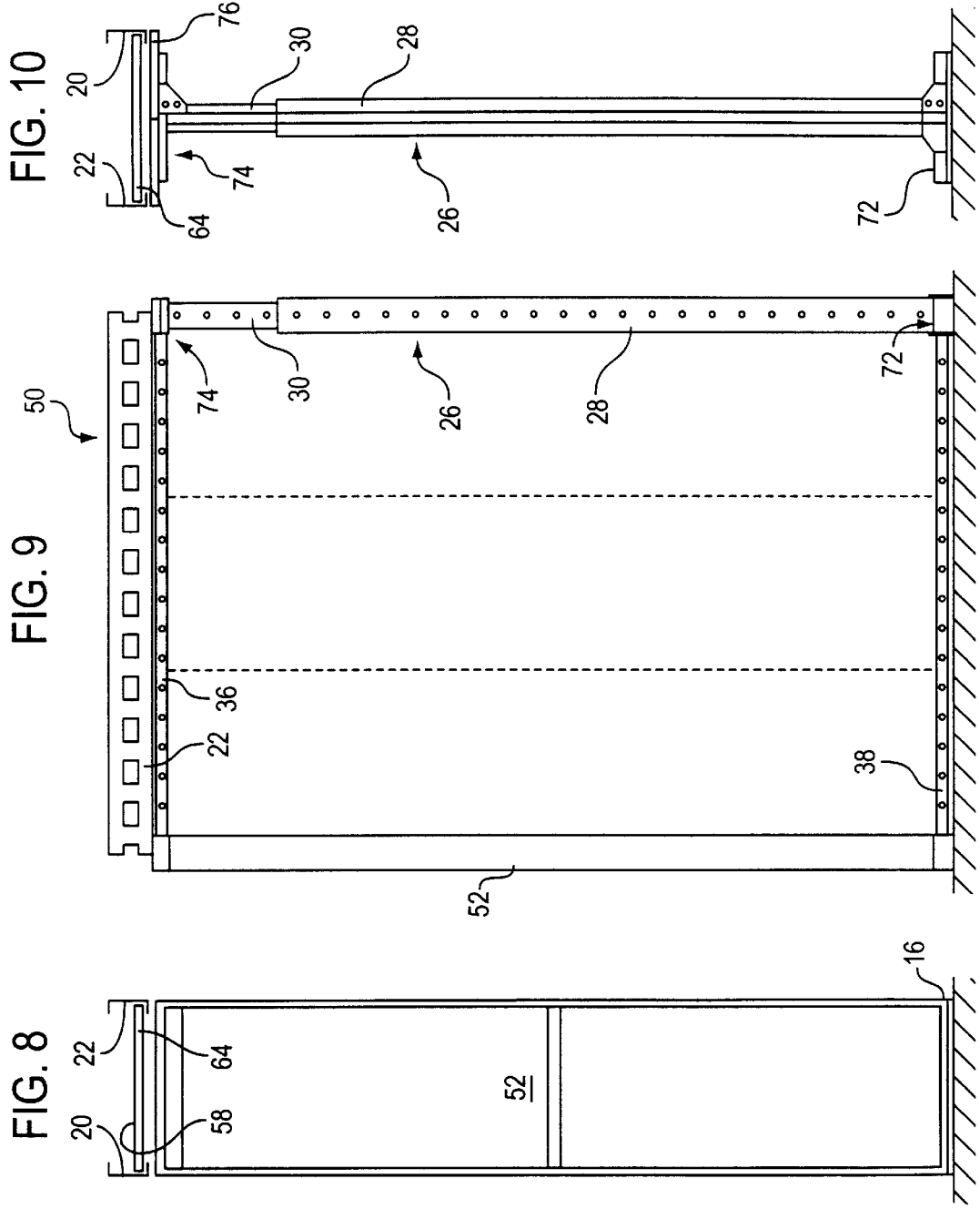

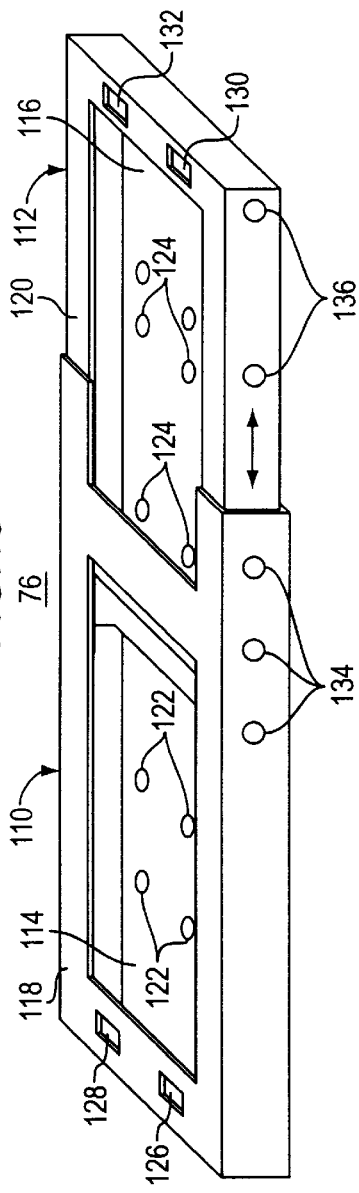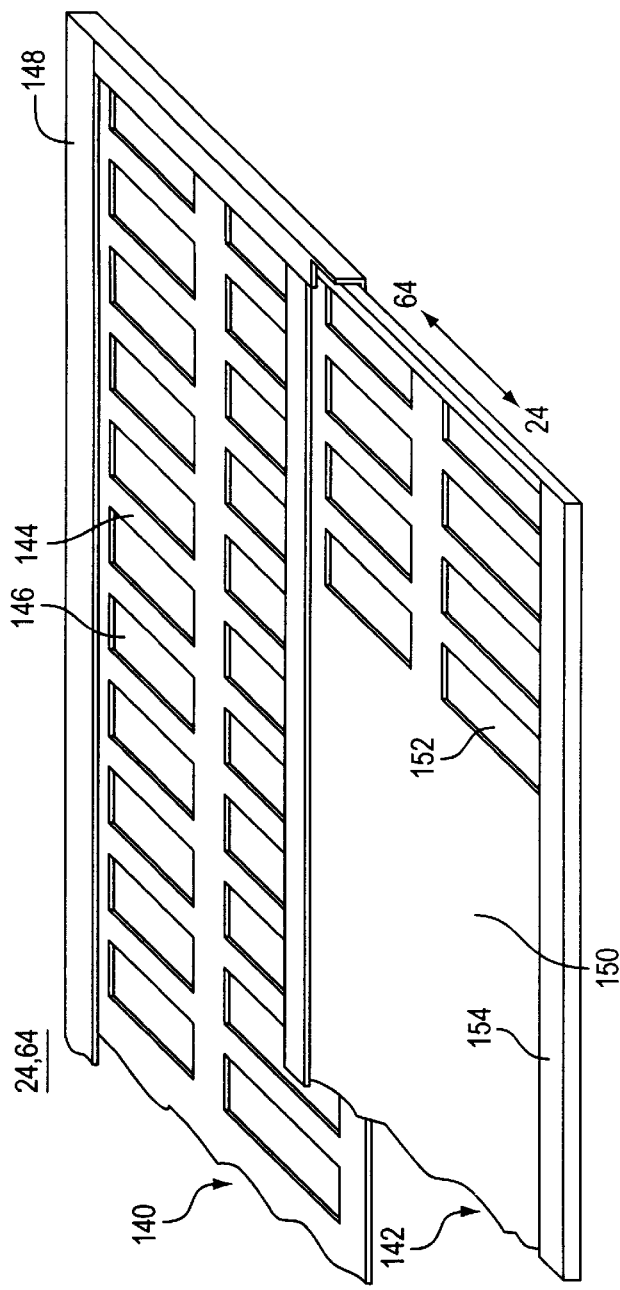

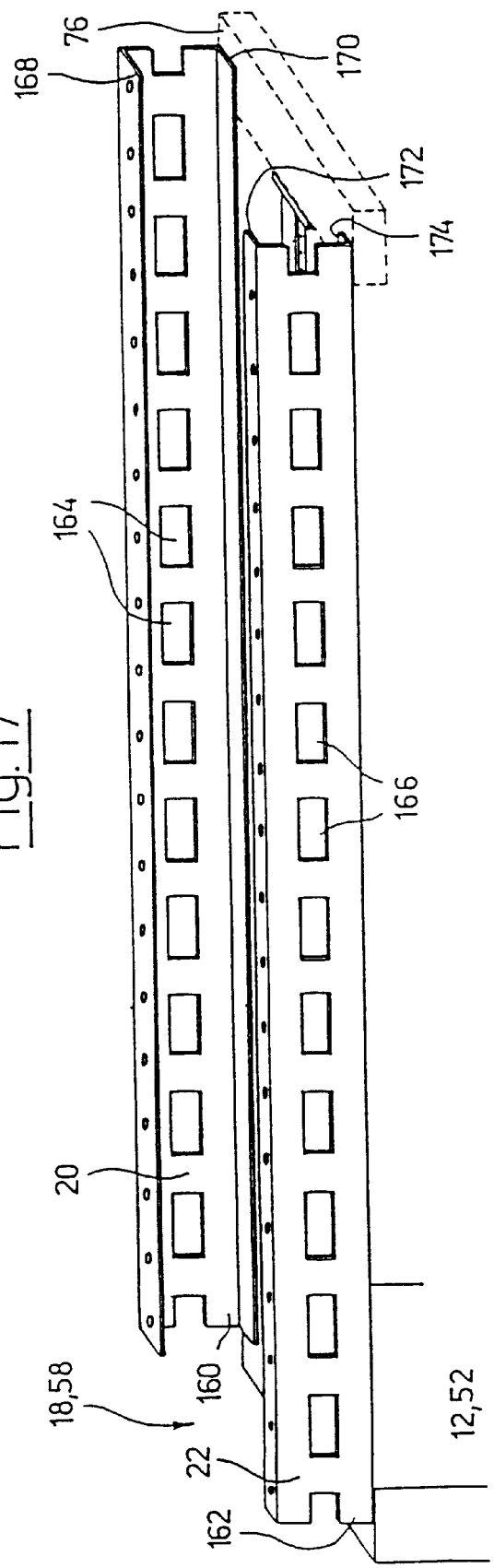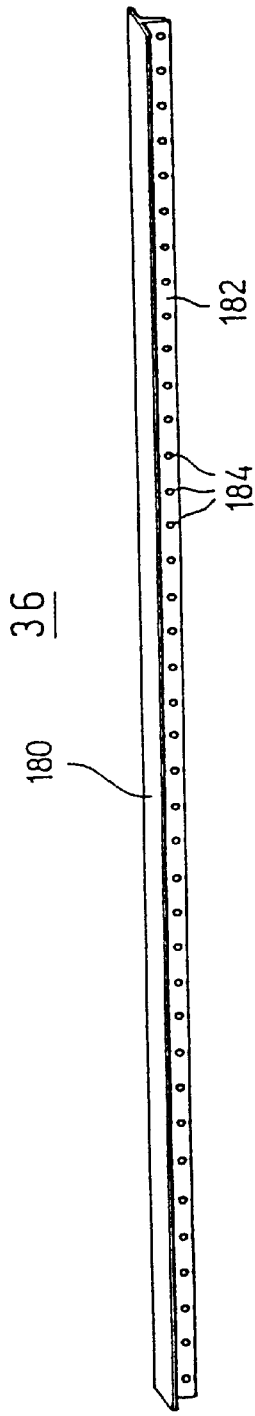

CABINET STRUCTURE, HAVING VARIABLE SIZE, FOR ELECTRIC AND/OR ELECTRONIC EQUIPMENTS

BACKGROUND OF THE INVENTION

The present invention regards a cabinet structure to be employed for housing electric and/or electronic equipments, for example, phone exchanges, multiplex equipments for transmitting either phone or data signals, or the like.

Generally, these cabinet structures are comprised of a front cabinet, housing power supplies and signal generating machines and a room behind the cabinet for housing, fastened between a top beam and a bottom beam, a plurality of vertical frames, bearing the equipments, being the room defined between the front cabinet, a rear column, a top structure for bearing connecting cables and possible closing walls and doors for the entrance thereinto.

A problem faced in providing these kinds of cabinet structures to manufacturers of electric and electronic equipments is the variability of some size which at present compels the supplier to hold a large inventory of components to satisfy the requirements of the customers, substantially consisting said components of front cabinets which can range, for example, from 2,600 to 2,200 mm, according to the installation of either traditional or compact equipments, and can be of either standard simple width (300 mm) or double width (600 mm), according to the fact that the cabinet structure is to be installed against a wall or in a middle of a room, being so expected either simple or double columns, respectively, of equipments to be installed in the space behind the front cabinet.

SUMMARY OF THE INVENTION

It is an object of the present invention to reduce the problem of the number of components to be held in inventory, by making some of these components variable in size, so that they can be indifferently installed in every kind of cabinet structure, as required by the customers.

In the prior art EP-A-0 420 491 discloses and claims an equipment rack whose frame member vertical arms include means having the double purpose to define channels suitable to receive cable restraint devices and to serve as keyways to permit a telescopic sliding of upper arm portions with respect to lower arm portions in order to have a rack of variable height serving as a frame for a large variety of cabinets having a large range of heights. This approach, even if it could have some interest because it could provide just one adjustable frame for every kind of an available cabinet, is not of specific utility for the present invention because the standard heights of the cabinets to be used are just two (2,200 and 2,600 mm) and there is no specifical interest for intermediate heights. Further, the cabinets used in the present invention are usually frameless and selfsustaining and do not require such a kind of rack.

The above mentioned problem is solved by using a rear column whose height can be regulated at the installation time between the maximum one expected for the traditional equipments and the minimum one expected for compact equipments and whose bottom and top ends can be of simple width for cabinets of simple standard width and of double width for cabinets of double standard width.

The column solving the above mentioned problem is comprised of a first fixed shaft of a height substantially equal to the minimum eight of the cabinets for compact equipments, comprising telescoped into the same a portion of slidable shaft and fastenable to the fixed shaft at different heights to equal the height of the front cabinet of the structure, provided with a simple foot, whose extension forms with the shaft a width similar to the width of the cabinet of simple standard width, to which the foot can be added, fastened to it, a member protruding in opposite direction with respect to the foot to form, in assembly, a foot of the width similar to the width of the cabinet of a double standard width and with a simple head whose extension forms with the shaft a width similar to the width of the cabinet of simple standard width and, with the addition of a member thereto fastened, gains an extension corresponding to the double standard width.

For a better operation of the invention, on the head of the column is installed an adapting head of comprised of two telescoped portions, of substantially equal width, inserted one into the other, and fastenable in two positions assuring to the same head two different sizes of the same order of the two standard widths of the front cabinets.

To further improve the invention, on the cabinet structure is installed a raceway comprised of two C-shaped lateral profiles and provided with grid-shaped bottom plates, these grid plates being formed by two telescoping portions to embody, according to the each other taken positions, grids corresponding to either the cabinets of a simple standard width or grids corresponding to the cabinets of a double standard width.

Particularly, the cabinets for traditional equipments have the height of 2,600 mm and those for compact equipments have the height of 2,200 mm.

Also the simple standard width of the cabinets is 300 mm and the double standard width is 600 mm.

The features of the present invention are defined in the claims forming the conclusive portion of the present description. However, other features and advantages will be apparent from the following detailed description of an embodiment thereof provided with the enclosed drawings.

BRIEF DESCRIPTION OF THE DRAWINGS

FIG. 1 depicts a frontal view of a cabinet of a simple standard width for housing power supplies and/or signal generating machines;

FIG. 2 depicts a lateral view of a structure, according to the invention, fastened to the cabinets of FIG. 1 and provided with a telescoping column;

FIG. 3 depicts a rear view of the telescoping column of the structure depicted in FIG. 2;

FIG. 8 depicts a frontal view of a cabinet of double standard width, for housing power suppliers and/or signal generating machines;

FIG. 9 depicts a lateral view of a structure, according to the invention, fastened to the cabinet of FIG. 8 and provided with a telescoping column;

FIG. 10 depicts a rear view of the telescoping column of the structure depicted in FIG. 9;

FIG. 15 depicts a telescoping head to be mounted on the head of the column;

FIG. 16 depicts a telescoping grid to be provided to the bottom of a raceway mounted on the cabinet structure of the present invention;

FIG. 17 depicts a raceway structure accomodating every cabinet structure of the invention; and FIG. 18 depicts a T-shaped crossbeam particularly useful in the present invention.

DETAILED DESCRIPTION OF THE PRESENT INVENTION

Figure 4:
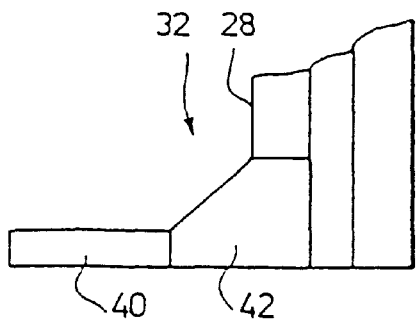
FIG. 4 depicts a rear view of the column foot.

Looking first at FIGS. 1 to 3, it is seen that a cabinet structure 10, to be installed against a wall, comprises a front cabinet 12 of a simple standard width, provided to house power suppliers and/or signal generating machines, leaning against a wall 14 and on a floor 16, bearing on the top a raceway 18 formed by two side C-shaped profiles supporting grid bottom plates 24.

At some distance from the front cabinet 12 is placed a column 26 comprising a first fixed shaft portion 28 into which is telescoped a second shaft portion 30 fastenable in preset positions determined by means per se well known to people skilled in the art of metal structures. The column 26 is provided with a foot 32 and a head 34, the foot 32 serving to lean the column itself on the floor 16 and the head 34 serving to support the end of the raceway 18 and of an upper crossbeam 36, fastened at the other end to the cabinet 12, to allow passage and distribution of cables from and to the cabinet 12 and the equipments housed in the structure 10 and for fastening frames bearing equipments between the upper crossbeam 36 and a lower crossbeam 38.

Figure 5:
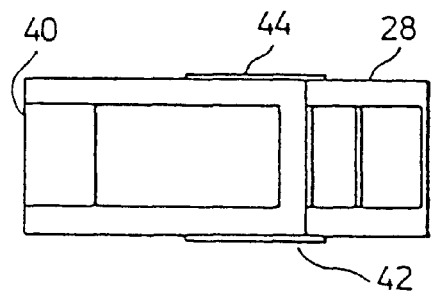
FIG. 5 depicts a bottom view of the foot itself.

As seen in FIGS. 4 and 5, the foot 32 is formed by a first base member 40 connected by square flanges 42 and 44 welded to the fixed shaft 28.

Figure 6:
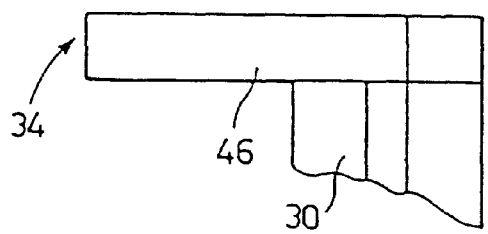
FIG. 6 depicts a rear view of the column head.
Figure 7:
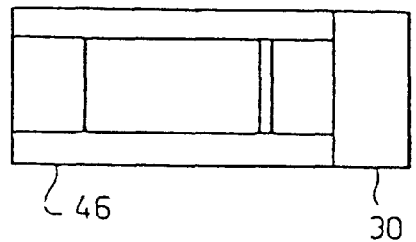
FIG. 7 depicts a top view of the head itself.

As seen in FIGS. 6 and 7, the head 34 is formed by a first cross member 46 fastened, for example by welding to the movable telescoping shaft 30.

Looking at FIGS. 8 to 10, it is seen that a cabinet structure 50, to be installed in the middle of a room, comprises a front cabinet 52 of a double standard width, provided for housing power suppliers and/or signal generating machines leaning on a floor 16, bearing on the top a raceway 58 formed by two C-shaped side profiles 20 and 22 supporting grid bottom plates 64.

At some distance from the front cabinet 52 is placed a column 26 comprising a first portion of the fixed shaft 28 into which is telescoped a second portion of the movable shaft 30 fastenable in preset positions determined by means per se well known to people skilled in the art of metal structures. The column 26 is provided with a foot 72 and a head 74, the foot 72 serving to lean the column itself on the floor 16 and the head 74 serving to support an end of the raceway 58 and of an upper crossbeam 36, fastened at the other end to the cabinet 52, to allow passage and distribution of cables from and to the cabinet 52 and the equipments housed into the structure 50 and for fastening frames bearing equipments between the upper crossbeam 36 and a lower crossbeam 38.

Actually, on the head 74 is fastened a telescoping head 76 which is also present in the case of the simple cabinet 12 but can be hardly seen because it has substantially the same extension as the head 34, while in the case of the double cabinet, the head is clearly seen because it has an extension of the same order as the cabinet 52, which is well wider than the head 74 to allow a proper distance for the side C-shaped profiles 20 and 22 forming the raceway 58.

Figure 11:
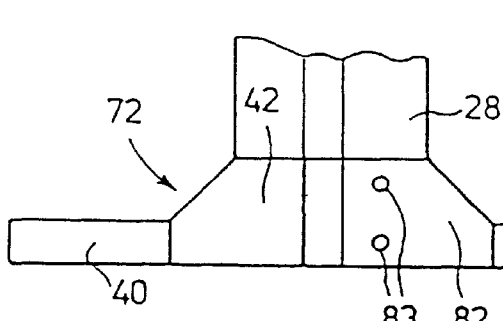
FIG. 11 depicts a rear view of the column foot.
Figure 12:
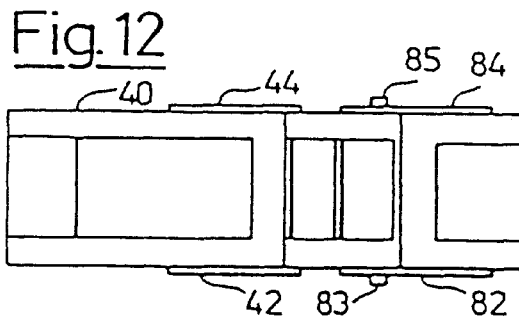
FIG. 12 depicts a bottom view of the foot itself.

As visible in FIGS. 11 and 12, the foot 72 is formed by a first base member 40 connected by means of square flanges 42 and 44 welded to the fixed shaft 28 and by a second additional base member 80 provided with two square flanges 82 and 84 welded to the same member 80 and fastenable by means of, for example bolts 83 and 85, to the shaft 28 itself in order to substantially double the extension of the foot 72 with respect to the foot 32.

Figure 13:
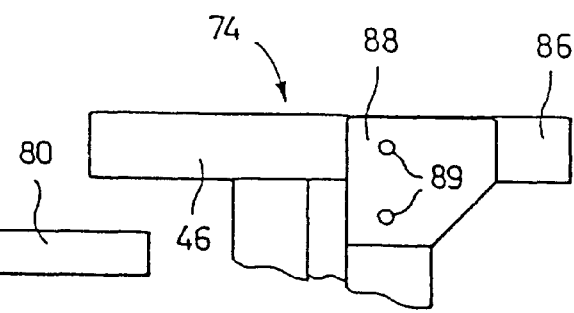
FIG. 13 depicts a rear view of the column head.
Figure 14:
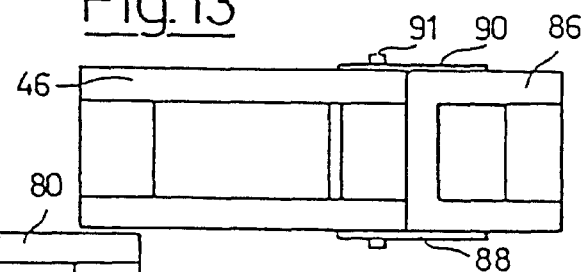
FIG. 14 depicts a top view of the head itself.

As visible in FIGS. 13 and 14, the head 74 is formed by a first cross member 46 fastened, for example by means of welding, to the movable telescoping shaft 30 and by a second additional member 86 provided with two square flanges 88 and 90 welded to the member 86 itself and fastenable by means of bolts 89 and 91 to the shaft 30 in order to substantially double the extension of the head 74 with respect to the head 34.

Let us refer to FIG. 15 depicting in detail the telescopic head 76 already visible in FIG. 10.

The head 76 consists of two members 110 and 112 of which the second member 112 is telescoping into the first member 110, so that when it is completely inserted it reaches the length of the same order as that of the simple cabinet 12 and when it is substantially extended it reaches a width equal to that of the double cabinet 52.

The two members 110 and 112 consist of two parallelepiped shaped shells provided with bottom lands 114 and 116 and top frames 118 and 120, the bottom lands provided with hole sets 122 and 124, respectively, to permit the passage of the fastening means, such as screws or bolts, to the underlying head 34 or 74 of the column 26. Of course, the hole sets 122 and 124 are arranged in such a way that, when the two members 110 and 112 are completely collapsed, they coincide with each other as a single assembly.

The frames 118 and 120 are provided with apertures 126 and 128, 130 and 132 respectively, housing on the bottom in proper seats nuts or similar means to allow engagement with the screws or bolts themselves for the fastening of the side profiles 20 and 22 of the raceways 18 or 58, as visible in the FIGS. 1 to 3 and FIGS. 8 to 10.

On an internally faced side the members 110 and 112 are provided with hole sets 134 and 136, respectively, allowing the engagement of fastening members for the upper crossbeam 36, the hole sets which coincide with each other when the two members 110 and 112 are completely collapsed.

Let us refer to FIG. 16 depicting one of the grid bottom plates 24 or 64 of the raceway 18 or 58.

Like in case of the telescoping head 76 these grid bottom plates are formed by two telescoping members 140 and 142 which, when they are completetly collapsed form the narrow grid 24 and when they are sustantially extended form the wide grid 64, as depicted by the double arrow shown in the figure.

The member 140 has a large bottom surface 144, provided with a plurality of properly arranged windows 146, serving as the passage for cables, and an inside faced frame 148 interrupted along the side allowing the insertion of the member 142 into the member 140.

The member 142 has a large bottom surface 150, provided with a plurality of properly arranged windows 152, serving as the passage for cables, and an inside faced and integral frame 154 improving the stiffness of the member 142 itself and its telescopic sliding into the member 140. Of course, the pluralities of windows 146 and 152 are sized and arranged in such a way to substantially coincide with each other when the two members 140, 142 are completely inserted.

The FIG. 17 shows in detail the raceway 18 or 58 to be installed on the simple cabinet 12 or the double cabinet 52, respectively. The raceway is formed by two C-shaped side profiles 20 and 22 having body portions 160 and 162 provided with lightening windows 164 and 166, respectively, and folded upper and lover stiffening edges 168 and 170, 172 and 174, respectively.

As visible in FIG. 17, the raceway leans, at the front side, through the bottom edges 170 and 174 of the two profiles 20 and 22 on the cabinet 12 or 52 and at the rear side on the telescoping head 76 which, obviously will be either completely collapsed or extended and it is realized that on the same bottom edges 170 and 174 will lean the grid bottom plates 24 or 64 either collapsed or extended depending on the present cabinet 12 or 52.

At last, FIG. 18 shows an example of the upper crossbeam 36 which in the specific case is a T-shaped profile having a solid head 180 and a leg 182 provided with a plurality of holes 184 used to fasten vertical frames bearing equipments to be housed in the cabinet structure of the invention.

The utility of the present invention consists mainly in the great number of components usable through simple modifications for both simple cabinets 12 and double cabinets 52.

What has been hereabove disclosed describes a not limiting embodiment of the present invention of which can be devised obvious variations and alternative approaches to be intended as here covered.

For example, the grid bottom plates 24 or 64, instead of being formed by bottom plates 144 and 150 pierced by windows 146 and 152, can be formed by rectangular frames whose opposed longer sides are connected by rounded crosspieces better insuring the integrity of the cables passing through the grid themselves, said crosspieces being formed either by round rods welded to the longer sides of the frames or by folding, according to a relatively large radius, plate edges formed from the bottom plates 144 and 150.

Further, it is to be indicated that the cabinet structure 10 or 50 must not be limited to just one space defined between the front cabinet 12 or 52 and column 26, but they can be modularly repeated, by providing, in addition to the first column 26, other columns spaced and connected to the column and to each other by crossbeams as the crossbeams, 36 and 38 depicted in the FIGS. 2 and 9, and by raceways 18 or 58 formed by profiles 20 and 22 connected by grid bottom plates 24 or 64.

We claim:

1. A variable size cabinet structure comprising a front cabinet and a variable height rear column the height of which can be set at the installation time between a maximum height required for a traditional size equipment and a minimum height required for a compact size equipment, said rear column including a foot assembly at the bottom thereof and a head assembly at the top thereof, and a shaft assembly including a fixed shaft having substantially a height corresponding to the minimum height of cabinets for compact size equipment and being coupled to said foot assembly to support the rear column on a floor, and a slidable shaft telescopically inserted in said fixed shaft and being fastenable to said fixed shaft at different heights to comply with the height of said front cabinet, said foot assembly including a foot having an extension extending from said shaft assembly in one transversal direction thereto so as to form, in cooperation with said shaft assembly the foot assembly having a width corresponding to a width of the front cabinet of a simple standard size, and a first member fastenable to said foot and protruding in another transversal direction opposite to said one transversal direction to form the foot assembly having a width corresponding to a width of the front cabinet of a double standard size, said head assembly including a head having an extension protruding in one transversal direction with respect to said slidable shaft and having a width corresponding to the width of the front cabinet of the simple standard size, a second member protruding in another transversal direction with respect to said slidable shaft opposite to said one transversal direction and being fastenable to said head to form an alternative head and head assembly having a width corresponding to the width of the double standard size of the front cabinet, and a telescoping head supported on one of said heads of said head assemblies and being formed by two telescopically positioned parts of a substantially equal width, one of said two telescopically positioned parts being inserted into another of said two parts and being fastenable thereto in two positions to respectively provide two sizes of the same order of said heads of said head assemblies in correspondence with the two standard widths of the front cabinet.

2. The cabinet structure as claimed in claim 1, and further comprising a cable supporting raceway formed by two lateral C-shaped profiles having grid-structured bottoms formed by two telescopic parts, one part of said telescopic parts insertable into another of said telescopic parts to form, depending on a reciprocal relative position of said two telescopic parts, grids of a size corresponding to the width of the simple standard size of the front cabinet or grids of a size corresponding to the width of the double standard size of the front cabinet.

3. The cabinet structure as claimed in claim 2, wherein said grid-structured bottoms of said two telescopic parts have respective bottom surfaces formed as rectangular frames having longer sides which are connected to each other by crosspieces.

4. The cabinet structure as claimed in claim 3, wherein said crosspieces are formed by rods welded to said longer sides of said rectangular frames.

5. The cabinet structure as claimed in claim 4, wherein said bottom surfaces have edges and said crosspieces are formed by bending said edges.

6. The cabinet structure as claimed in claim 1, wherein the front cabinet for the traditional size equipment is 2600 mm in height and the front cabinet for said compact size equipment is 2200 mm in height.

7. The cabinet structure as claimed in claim 1, wherein the width of the front cabinet of the simple standard size is 300 mm and the width of the front cabinet for the double standard size is 600 mm.

8. The cabinet structure as claimed in claim 1; said cabinet structure for bearing the equipment, comprising an upper crossbeam supported on said head assembly and coupled to said front cabinet to allow passage and distribution of cables between said front cabinet and the equipment, and a lower crossbeam provided between said foot assembly and said front cabinet at a lower end of the cabinet structure, said structure for bearing the equipment between said upper crossbeam and said lower crossbeam.

* * * * *